United States Patent
Wang

(10) Patent No.: US 10,109,810 B2
(45) Date of Patent: Oct. 23, 2018

(54) FLEXIBLE DISPLAY PANEL, PACKAGE METHOD THEREOF AND DISPLAY DEVICE

(71) Applicant: BOE TECHNOLOGY GROUP CO., LTD., Beijing (CN)

(72) Inventor: Wei Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 31 days.

(21) Appl. No.: 15/258,405

(22) Filed: Sep. 7, 2016

(65) Prior Publication Data

US 2017/0194579 A1 Jul. 6, 2017

(30) Foreign Application Priority Data

Jan. 6, 2016 (CN) .......................... 2016 1 0009622

(51) Int. Cl.
| | | |
|---|---|---|
| *H01L 21/46* | (2006.01) | |
| *H01L 21/30* | (2006.01) | |
| *H01L 51/00* | (2006.01) | |
| *H01L 51/56* | (2006.01) | |
| *H01L 51/52* | (2006.01) | |

(52) U.S. Cl.
CPC ...... *H01L 51/0097* (2013.01); *H01L 51/0024* (2013.01); *H01L 51/5246* (2013.01); *H01L 51/56* (2013.01)

(58) Field of Classification Search
CPC .......... H01L 51/00; H01L 51/52; H01L 51/56
USPC ....... 257/79, 94, 98–100, E33.068, E33.069; 438/460–462, 464
See application file for complete search history.

(56) References Cited

U.S. PATENT DOCUMENTS

| | | | |
|---|---|---|---|
| 5,435,876 A | 7/1995 | Alfaro et al. | |
| 6,461,893 B2 * | 10/2002 | Hyoudo | ................. H01L 23/10 257/792 |
| 2003/0013232 A1 * | 1/2003 | Towle | ................. H01L 23/5389 438/113 |
| 2004/0009631 A1 * | 1/2004 | Connell | ................. H01L 21/561 438/127 |

(Continued)

FOREIGN PATENT DOCUMENTS

| | | |
|---|---|---|
| CN | 1100563 A | 3/1995 |
| CN | 103915473 A | 3/1995 |
| CN | 10461703 A1 | 5/2015 |

OTHER PUBLICATIONS

First Chinese Office Action dated Sep. 29, 2017.

*Primary Examiner* — Sheikh Maruf
(74) *Attorney, Agent, or Firm* — Dilworth & Barrese, LLP.; Michael J. Musella, Esq.

(57) ABSTRACT

A flexible display panel, a package method thereof and a display device are provided. The package method includes: bonding a barrier film provided with an adhesive layer on a surface of a side of a display motherboard away from a substrate of the display motherboard, the non-adhesive portion of the adhesive layer loses adhesivity and covers the bonding area; the adhesive portion at least covers the display area; cutting the display motherboard provided with the barrier film, so that the adhesive portion for covering the display area is separate from adjacent portions, and a portion to be retained and a portion to be removed in the barrier film are separate; and stripping off portions, except the adhesive portion for covering the display area, in the adhesive layer and the portion to be removed in the barrier film.

11 Claims, 11 Drawing Sheets

(56) References Cited

U.S. PATENT DOCUMENTS

| | | | |
|---|---|---|---|
| 2006/0003474 A1* | 1/2006 | Tyan | H01L 51/56 |
| | | | 438/22 |
| 2010/0181650 A1* | 7/2010 | Shigihara | H01L 21/6836 |
| | | | 257/620 |
| 2011/0207252 A1* | 8/2011 | Jeong | H01L 33/42 |
| | | | 438/27 |
| 2013/0112966 A1* | 5/2013 | Sassa | H01L 51/5092 |
| | | | 257/40 |
| 2013/0234193 A1* | 9/2013 | Odnoblyudov | H01L 33/0095 |
| | | | 257/99 |
| 2015/0155505 A1* | 6/2015 | Yamazaki | H01L 51/003 |
| | | | 257/40 |
| 2015/0314561 A1 | 11/2015 | Kim et al. | |
| 2016/0087240 A1* | 3/2016 | Choi | H01L 51/5203 |
| | | | 257/40 |
| 2016/0149158 A1* | 5/2016 | Lang | H01L 51/524 |
| | | | 257/40 |
| 2016/0154178 A1* | 6/2016 | Jaeger | H01L 51/5275 |
| | | | 385/14 |
| 2016/0154268 A1* | 6/2016 | Yamazaki | H01L 51/5246 |
| | | | 349/138 |
| 2016/0155833 A1* | 6/2016 | Yoshinaga | H01L 29/7397 |
| | | | 257/144 |
| 2017/0309690 A1* | 10/2017 | Jang | H01L 51/5281 |

* cited by examiner

FLEXIBLE DISPLAY PANEL, PACKAGE METHOD THEREOF AND DISPLAY DEVICE

TECHNICAL FIELD

The present disclosure relates to a flexible display panel, a package method thereof and a display device.

BACKGROUND

Compared with the traditional display device, flexible organic light-emitting diode (OLED) display device receives more and more concern from people due to the characteristics of good flexibility, small size, low power consumption, etc.

SUMMARY

At least one embodiment of the disclosure provides a package method of a flexible display panel, comprising: bonding a barrier film provided with an adhesive layer on a surface of a side of a display motherboard away from a substrate of the display motherboard, in which the display motherboard includes: a plurality of display panel areas; each display panel area includes: a display area and a bonding area close to the display area; the adhesive layer is disposed between the barrier film and the display motherboard and includes a non-adhesive portion and an adhesive portion; the non-adhesive portion loses adhesivity after being subject to treatment process and covers the bonding area; the adhesive portion has adhesivity and at least covers the display area; cutting the display motherboard provided with the barrier film, so that the adhesive portion for covering the display area in the adhesive layer is separate from adjacent portions, and a portion to be retained and a portion to be removed in the barrier film are separate from each other, in which the portion to be retained covers the display area and the portion to be removed covers areas except the display area in the display motherboard; and stripping off portions, except the adhesive portion for covering the display area, in the adhesive layer and the portion to be removed in the barrier film.

For example, the display motherboard further includes: a spaced area disposed between two adjacent display panel areas; and the adhesive portion of the adhesive layer also covers the spaced area.

For example, cutting the display motherboard provided with the barrier film includes: cutting from a position on a side of the substrate corresponding to a boundary line between the bonding area and the spaced area along a direction perpendicular to the substrate, and stopping cutting at an interface between the adhesive layer and the display motherboard; cutting from a position on a side of the barrier film corresponding to a boundary line between the bonding area and the display area along a direction perpendicular to the barrier film, and stopping cutting at the interface between the adhesive layer and the display motherboard; and cutting from a position on the side of the barrier film corresponding to a boundary line between the spaced area and the display area in the direction perpendicular to the barrier film, until the substrate is cut.

For example, after bonding the barrier film provided with the adhesive layer on the surface on a side of the display motherboard away from the substrate of the display motherboard and before cutting the display motherboard, the package method further comprises: stripping off the substrate of the display motherboard; and forming a protective film on a surface of the display motherboard which is exposed after the substrate is stripped off.

For example, cutting the display motherboard provided with the barrier film includes: cutting from a position on a side of the protective film corresponding to a boundary line between the bonding area and the spaced area along a direction perpendicular to the protective film, and stopping cutting at an interface between the adhesive layer and the display motherboard; cutting from a position on a side of the barrier film corresponding to a boundary line between the bonding area and the display area along a direction perpendicular to the barrier film, and stopping cutting at the interface between the adhesive layer and the display motherboard; and cutting from a position on a side of the barrier film corresponding to a boundary line between the spaced area and the display area along the direction perpendicular to the barrier film, until the protective film is cut.

For example, the adhesive layer is an adhesive layer sensitive to light; and before bonding the barrier film provided with the adhesive layer on the surface on the side of the display motherboard away from the substrate of the display motherboard, the method further comprises: forming the adhesive layer on the barrier film; and performing exposure on the adhesive layer via a mask, so that the non-adhesive portion in the adhesive layer is exposed and loses adhesivity and the adhesive portion in the adhesive layer is not exposed and keeps adhesivity.

For example, a pad is respectively disposed on both sides of the adhesive layer; before forming the adhesive layer on the barrier film, the package method further comprises: stripping off the pad on a side of the adhesive layer; forming the adhesive layer on the barrier film includes: bonding a side of the adhesive layer, on which the pad is stripped off, to the barrier film; and after performing exposure on the adhesive layer via the mask and before bonding the barrier film provided with the adhesive layer on the surface on a side of the display motherboard away from the substrate of the display motherboard, the package method further comprises: stripping off the pad on a side of the adhesive layer away from the barrier film.

For example, cutting the display motherboard provided with the barrier film includes: cutting the display motherboard by laser.

For example, a boundary of the bonding area and the display area in the display panel area is consistent with a boundary of the non-adhesive portion and the adhesive portion in the adhesive layer.

For example, an area covered by the non-adhesive portion is the same with an area covered by the bonding area.

For example, before stripping off the portion, except the adhesive portion for covering the display area, in the adhesive layer and the portion to be removed in the barrier film, the barrier film provided with the adhesive layer covers the entire area of the display motherboard.

At least one embodiment of the disclosure provides a flexible display panel, packaged by the package method as mentioned above. The flexible display panel can form a flexible display device.

At least one embodiment of the disclosure provides a display device, comprising the flexible display panel as mentioned above. The display device may be a display device such as a flexible OLED display and any product or component with display function such as a TV, a digital camera, a mobile phone and a tablet PC including the display devices.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

It should be noted that: in the description of the present invention, the orientation or position relationship indicated by the terms "on", "beneath" and the like is the orientation or position relationship as shown in the accompanying drawings, is only used for the convenient description of the present invention and the simplified description, does not indicate or imply that the indicated device or element must have specific orientation and be constructed and operated in specific orientation, and hence should not be construed as the limitation of the present invention.

In the description of the present invention, it should be understood that "A at least covers B" indicates that A is disposed on B and the coverage range of A at least includes the coverage area of B, namely the coverage range of B is within the coverage range of A in a bottom or top view along the direction perpendicular to A and B; and "A covers B" indicates that A is disposed on B and the coverage range of A is the same with the coverage range of B, namely the coverage range of A is the same with the coverage range of B in the bottom or top view along the direction perpendicular to A and B.

Figure 1A:
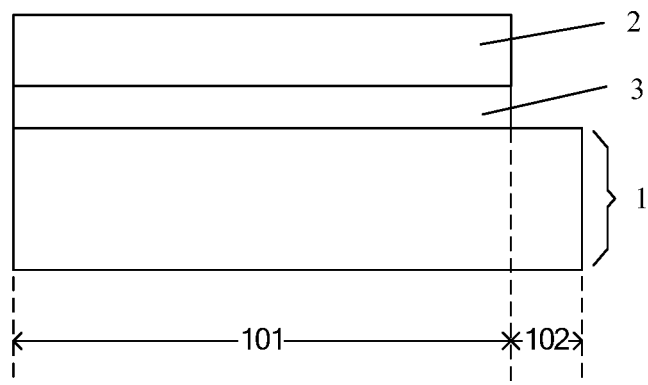
FIG. 1a is a schematic structural view of a flexible OLED display device.

FIG. 1a illustrates a flexible OLED display device. The flexible OLED display device comprises a flexible display panel 1 including display areas 101 and bonding areas 102. In order to protect layers disposed in the display areas 101, the flexible OLED display device further comprises a barrier film 2 which is disposed on the flexible display panel 1 and covers the display areas 101. The barrier film 2 is bonded on the flexible display panel 1 through glue 3.

Figure 1B:
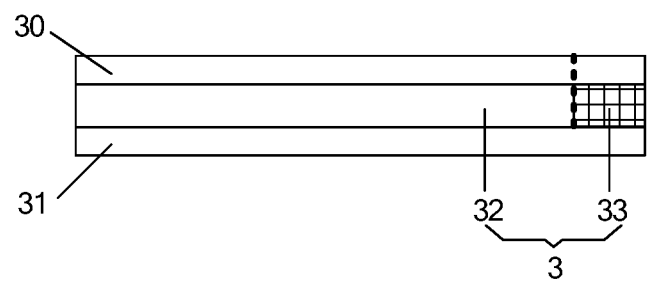
FIG. 1b is a schematic structural view of glue.
Figure 1C:
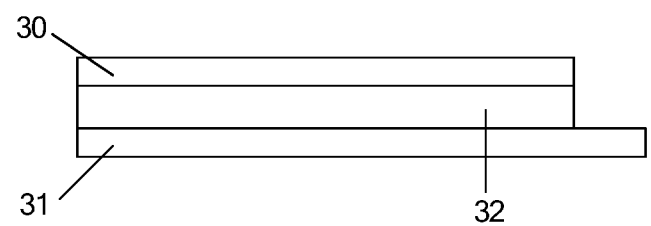
FIG. 1c is a schematic structural view of a structure obtained after removing a second adhesive portion of the glue in FIG. 1b and a first pad bonded with the second adhesive portion.

In a method for bonding the barrier film on the flexible display panel: firstly, as illustrated in FIG. 1b, in order to protect the glue from being polluted, a first pad 30 and a second pad 31 are respectively disposed on both sides of the glue 3, and the glue 3 is divided into first adhesive portions 32 and second adhesive portions 33. The first adhesive portion corresponds to a display area of the flexible display panel, and the second adhesive portion corresponds to a bonding area of the flexible display panel. The glue 3 and the first pad 30 are cut along a boundary line between the first adhesive portion and the second adhesive portion. Secondly, the second adhesive portion 33 of the glue 3 and the first pad bonded with the second adhesive portion are manually removed, and a structure as shown in FIG. 1c is obtained. Thirdly, the remaining first pad is removed and the first adhesive portion of the glue is adhered to the barrier film.

Finally, the second pad is removed and the barrier film provided with the glue is correspondingly adhered to the flexible display panel. In the above process, the second adhesive portion of the glue must be manually removed, which is not conducive to automatic package.

First Embodiment

Figure 2:
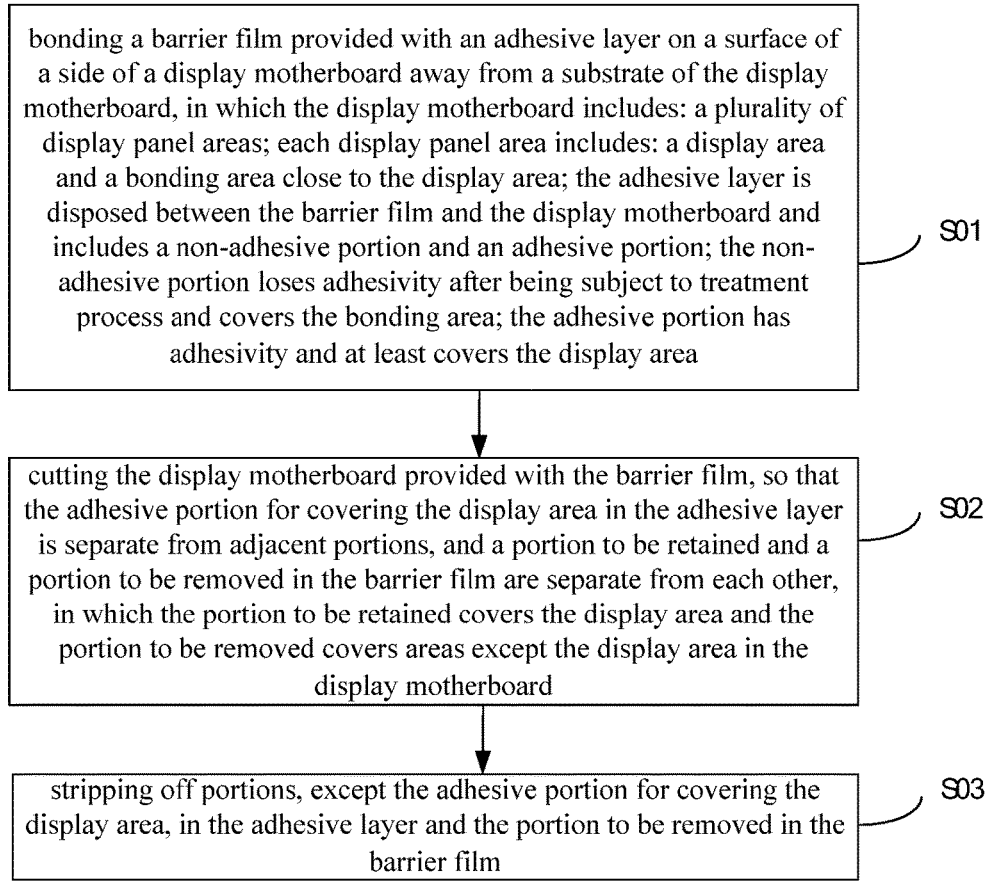
FIG. 2 is a flowchart of a package method of a flexible display panel provided by the embodiment of the present invention.
Figure 3:
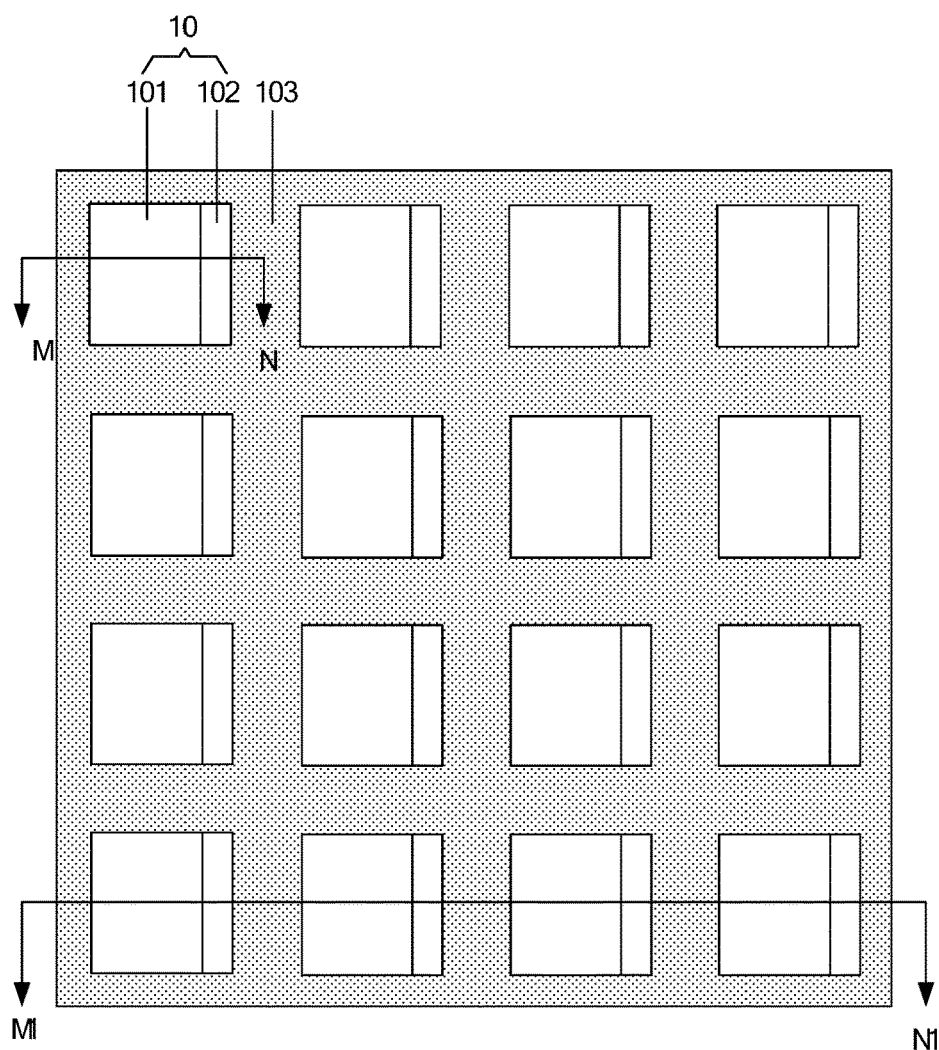
FIG. 3 is a schematic structural view of a flexible display motherboard provided by the embodiment of the present invention.
Figure 4:
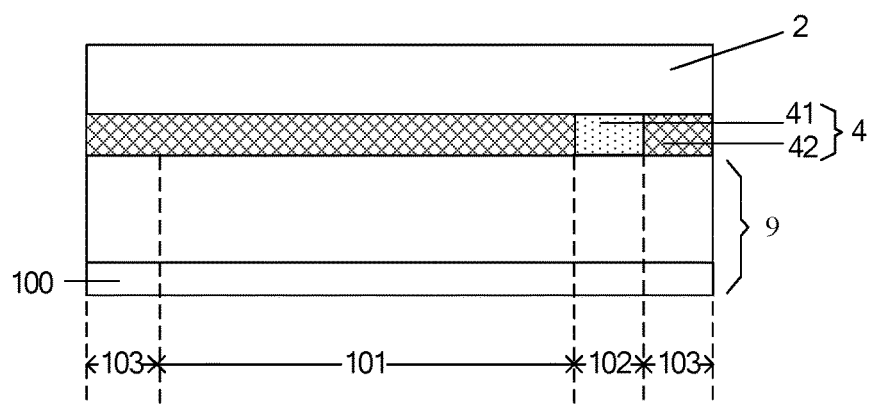
FIG. 4 is a sectional view of the flexible display motherboard in FIG. 3 along the M-N direction.

The embodiment of the present invention provides a package method of a flexible display panel. As illustrated in FIG. 2, the package method comprises:

S01: as illustrated in FIGS. 3 and 4, bonding a barrier film 2 provided with an adhesive layer 4 on a surface on a side of a display motherboard 9 away from a substrate 100 of the display motherboard 9, in which the display motherboard 9 includes: a plurality of display panel areas 10; each display panel area 10 includes: a display area 101 and a bonding area 102 close to the display area 101; the adhesive layer 4 is disposed between the barrier film 2 and the display motherboard 9 and includes a non-adhesive portion 41 and an adhesive portion 42; the non-adhesive portion 41 loses adhesivity after being subject to treatment process and only covers the bonding area 102; and the adhesive portion 42 has adhesivity and at least covers the display area 101.

The specific type of the adhesive layer is not limited in the embodiment of the present invention, as long as the non-adhesive portion loses adhesivity and the adhesive portion still keeps adhesivity after treatment process. Illustratively, the adhesive layer may be an adhesive layer which is only sensitive to a parameter, e.g., a photosensitive adhesive layer sensitive to UV light, a thermosensitive adhesive layer sensitive to heat, and a pressure-sensitive adhesive layer sensitive to pressure; or may also be a double-sensitive adhesive layer sensitive to two parameters, e.g., a double-sensitive adhesive layer sensitive to both UV light and pressure, and a double-sensitive adhesive layer sensitive to both UV light and pressure. No limitation will be given here in the present invention, specifically according to actual conditions. In addition, the treatment process is not limited in the embodiment of the present invention, specifically according to the type of the adhesive layer. Illustratively, when the adhesive layer is an adhesive layer sensitive to light, e.g., a photosensitive layer and a double-sensitive adhesive layer sensitive to both UV light and pressure, the exposure method can be adopted. More specifically, a mask may be adopted for the UV exposure of double-sensitive glue; a non-adhesive portion of the double-sensitive glue is cured after UV exposure; the cured non-adhesive portion will lose adhesivity; and an adhesive portion is not exposed and may keep the original adhesivity.

It should be noted that the case that the adhesive portion at least covers the display area includes: the coverage range of the adhesive portion at least includes the coverage range of the display area. That is to say, the adhesive portion may only cover the display area, or the adhesive portion may not only cover the display but also cover other areas. Illustratively, if the display motherboard is as shown in FIG. 3, the display motherboard further includes a spaced area 103 disposed between two adjacent display panel areas 10. Thus, as illustrated in FIG. 4, the adhesive portion 42 not only covers the display area 101 but also covers the spaced area 103. No specific limitation will be given here, specifically according to actual conditions.

For instance, as illustrated in FIG. 4, a boundary between the display area 101 and the bonding area 102 in the display panel area 10 is consistent with a boundary between the non-adhesive portion 41 and the adhesive portion 42 in the adhesive layer 4. That is to say, the two boundaries overlap each other in the direction perpendicular to the substrate 100.

For instance, as illustrated in FIGS. 3 and 4, an area covered by the non-adhesive portion 41 is the same with an area covered by the bonding area 102.

For instance, before the step of stripping off portions, except the adhesive portions for covering the display areas, in the adhesive layer and portion to be removed in the barrier film, the barrier film provided with the adhesive layer covers the entire area of the display motherboard.

Moreover, it should be noted that: in order to improve the production efficiency of the display panel, as illustrated in FIG. 3, the display motherboard includes a plurality of display panel areas 10; each display panel area 10 is configured to form layer structures of a display panel; and after the layers are formed, the display motherboard may be cut and a plurality of display panels can be obtained.

Figure 5:
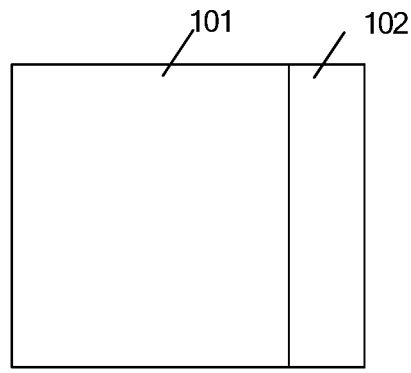
FIG. 5 is a schematic diagram illustrating the positional relationship between a bonding area and a display area in a display panel area provided by the embodiment of the present invention.
Figure 6:
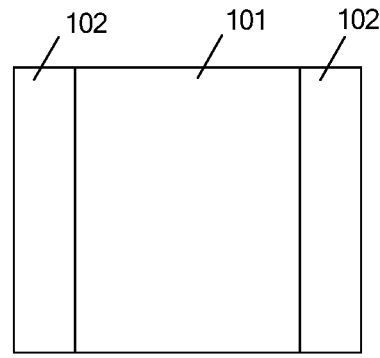
FIG. 6 is a schematic diagram illustrating the positional relationship between a bonding area and a display area in another display panel area provided by the embodiment of the present invention.

No limitation will be given to the shape of the display area and the bonding area in the embodiment of the present invention, specifically according to actual conditions. Illustratively, the display area may be rectangular, circular, etc., and the bonding area may be annular, rectangular, etc. In the prior art, most display devices are cuboids. Description is given in the embodiment of the present invention and the accompanying drawings by taking the case that the display area is rectangular as an example. Moreover, it should be noted that: if the display area is rectangular, the case that the bonding area is close to the display area may be as shown in FIG. 5, namely the bonding area 102 is close to a side of the display area 101; may also be as shown in FIG. 6, namely the bonding area 102 is close to two adjacent sides of the display area 101; and of course, the bonding area may also be close to three sides of the display area or close to all the sides of the display area, namely encircling the display area. No limitation will be given here. Currently, narrow-bezel display devices are widely applied. In order to narrow the bezel as much as possible, a structure as shown in FIG. 4 is generally selected, namely the bonding area is close to one side of the display area. Description is given in the embodiment of the present invention and the accompanying drawings by taking the case that both the display area and the bonding area are rectangular and the bonding area is close to one side of the display area as an example.

No limitation will be given to the specific structure of the flexible display panel in the embodiment of the present invention. Illustratively, the flexible display panel may be a flexible OLED display panel. It can be known by those skilled in the art according to the prior art that: the flexible OLED display panel may comprise a substrate and thin-film transistors (TFTs), OLEDs and the like formed on the substrate; the OLED may include an anode, a cathode and an organic function layer; the organic function layer may further include: a hole injection layer (HIL), a hole transport layer (HTL), an emission layer (EML), an electron transport layer (ETL) and an electron injection layer (EIL); and the layer structures in the OLED may be formed by vapor deposition and other means. As the OLED can be easily eroded by water and oxygen, before the barrier film is encapsulated, the OLED display panel may adopt chemical vapor deposition (CVD) to achieve the thin-film encapsulation of the OLED so as to protect the OLED. Moreover, in order to form a thinner flexible OLED display panel, a polyimide (PI) film making contact with the substrate may also be formed on the substrate. Thus, after the layers of the OLED display panel are formed, the substrate may be stripped off. At this point, the PI film may be taken as the substrate in one aspect and is conducive to the subsequent forming of a protective film in another aspect.

S02: cutting the display motherboard provided with the barrier film, so that the adhesive portion for covering the display area and adjacent portions in the adhesive layer are separate from each other and a portion to be retained and a portion to be removed in the barrier film are separate from each other, in which the portion to be retained covers the display area and the portion to be removed covers areas except the display area in the display motherboard.

Figure 7:
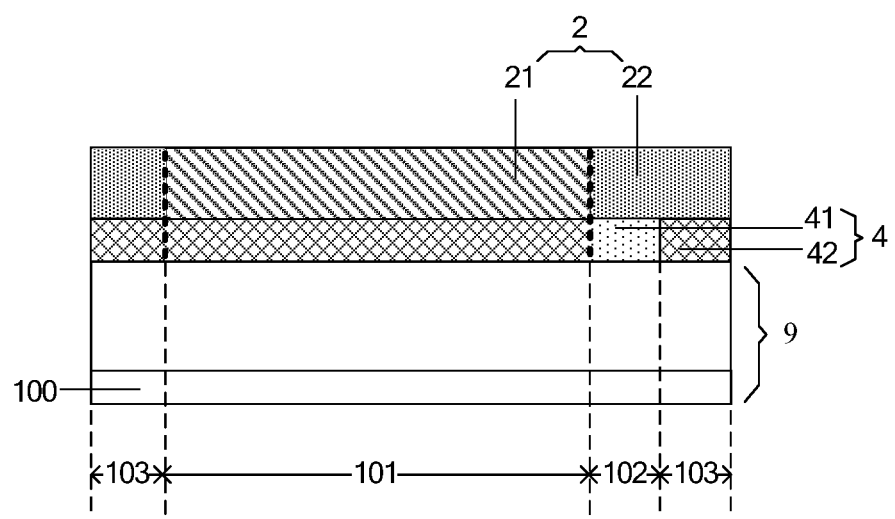
FIG. 7 is a schematic structural view illustrating the separation between a adhesive portion for covering a display area and adjacent portions in an adhesive layer in FIG. 4 and the separation between a portion to be retained and a portion to be removed in a barrier film.

The adhesive portion for covering the display area and the adjacent portions in the adhesive layer are separate from each other, in which the specific condition of the adjacent portions must be determined according to actual conditions. Illustratively, as illustrated in FIG. 3, the display motherboard further includes: a spaced area 103. Thus, as illustrated in FIG. 7, the adhesive portion 42 for covering the display area 101 in the adhesive layer 4 is separate from adjacent portions (namely the non-adhesive portion 41 and the adhesive portion 42 for covering the spaced area 103).

The portion to be removed covers the area other than the display area in the display motherboard, in which the specific condition of the area other than the display area must be determined according to actual conditions. Illustratively, as illustrated in FIG. 3, the display motherboard further includes: a spaced area 103. Thus, as illustrated in FIG. 7, the portion to be removed 22 covers the area (namely the bonding area 102 and the spaced area 103) other than the display area 101 in the display motherboard 9. At this point, the portion to be retained 21 covers the display area.

S03: striping off portions, except the adhesive portion for covering the display areas, in the adhesive layer and the portion to be removed in the barrier film.

The specific condition of the portions, except the adhesive portion for covering the display areas, in the adhesive layer must be determined according to actual conditions. Illustratively, as illustrated in FIG. 3, the display motherboard further includes: a spaced area 103. Thus, as illustrated in FIG. 7, the portions, except the adhesive portions 42 for covering the display areas 101, in the adhesive layer 4 are the non-adhesive portions 41 and the adhesive portions 42 for covering the spaced areas 103.

Figure 8:
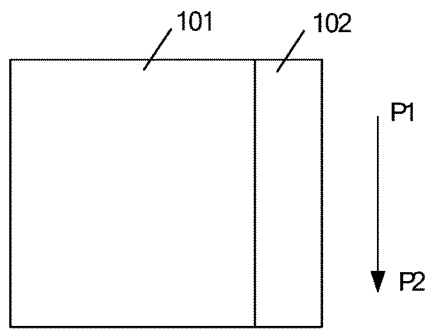
FIG. 8 is a schematic diagram of a stripping direction in the step S03 in FIG. 2.

In addition, no limitation is given to the stripping direction in the embodiment of the present invention. Illustratively, as illustrated in FIG. 8, if both the display area 101 and the bonding area 102 are rectangular and the bonding area 102 is close to a side of the display area 101, when the step S03 is executed, the stripping process may be performed along the P1P2 direction as shown in FIG. 8, namely along the long-side direction of the bonding area 102, so that the portions, except the adhesive portions for covering the display areas, in the adhesive layer and the portion to be removed in the barrier film can be stripped off.

The embodiment of the present invention provides a package method of a flexible display panel. In the method, due to the characteristic that the non-adhesive portion may lose adhesivity and the adhesive portion may still keep adhesivity after the treatment process of the double-sensitive glue, firstly, the barrier film provided with the adhesive layer is bonded on the surface on a side of the display motherboard away from the substrate of the display panel, so that the non-adhesive portion of the adhesive layer covers the bonding area and the adhesive portion of the adhesive layer at least covers the display area. Secondly, the display motherboard provided with the barrier film is cut, so that the adhesive portion for covering the display area and the adjacent portions in the adhesive layer are separate from each other and the portion to be retained and the portion to be removed in the barrier layer are separate from each others. Thus, the adhesive portion of the adhesive layer is separate from the adjacent non-adhesive portion, and the non-adhesive portion of the adhesive layer loses adhesivity, so the adhesion between the non-adhesive portion and the display motherboard is very low, and hence the difficulty in stripping off the non-adhesive portion of the adhesive layer from the display motherboard can be greatly reduced. At this point, the non-adhesive portion may be stripped off by mechanical means (e.g., a manipulator), so that the problem of difficulty in stripping by mechanical means and complex process of manual stripping can be solved, and hence automatic package can be achieved.

In order to avoid the mutual influence between adjacent display panel areas in the display motherboard, as illustrated in FIGS. 3 and 4, the display motherboard further includes: a spaced area 103 disposed between two adjacent display panel areas 10. The adhesive portion 42 of the adhesive layer also covers the spaced area 103.

Figure 9:
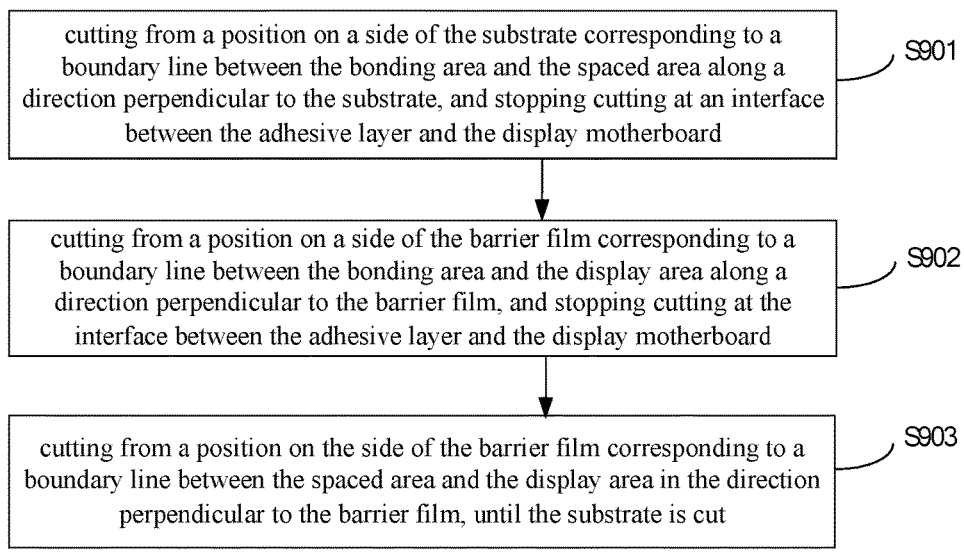
FIG. 9 is a flowchart of a method for cutting a flexible display motherboard provided with a barrier film, provided by the embodiment of the present invention.
Figure 10:
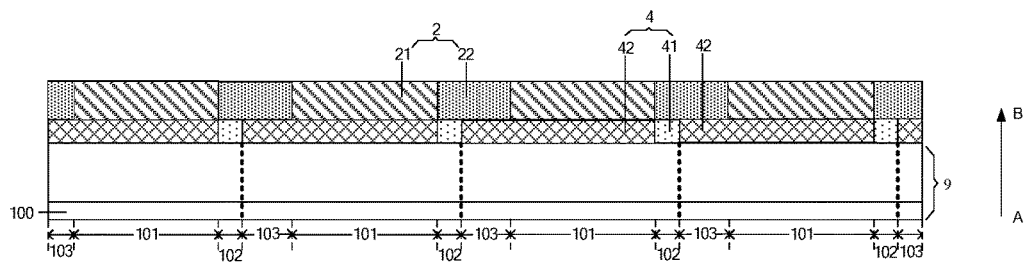
FIG. 10 is a cutting diagram of the sectional view along the M1-N1 direction in FIG. 3 corresponding to the step S901 in FIG. 9.

Moreover, optionally, as illustrated in FIG. 9, the step of cutting the display motherboard provided with the barrier film in S02, for instance, includes:

S901: as illustrated in FIG. 10, cutting from a position on a side of the substrate 100 corresponding to a boundary line between the bonding area 102 and the spaced area 103 in the AB direction perpendicular to the substrate 100, and stopping cutting at an interface between the adhesive layer 4 and the display motherboard 9.

Figure 11:
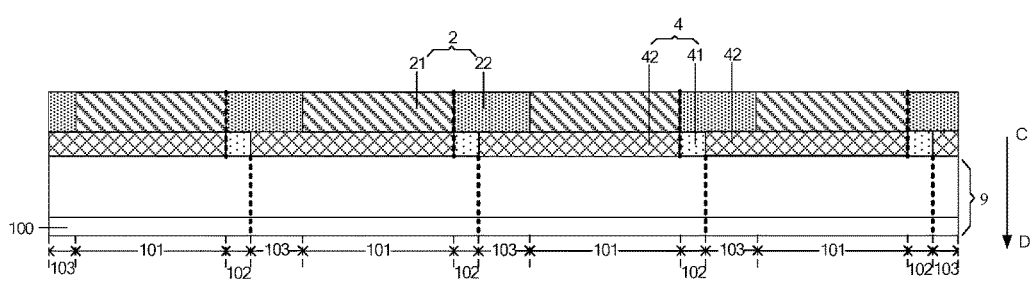
FIG. 11 is a cutting diagram of the sectional view along the M1-N1 direction in FIG. 3 corresponding to the step S902 in FIG. 9.

S902: as illustrated in FIG. 11, cutting from a position on a side of the barrier film 2 corresponding to a boundary line between the bonding area 102 and the display area 103 in the CD direction perpendicular to the barrier film 2, and stopping cutting at the interface between the adhesive layer 4 and the display motherboard 9.

Figure 12:
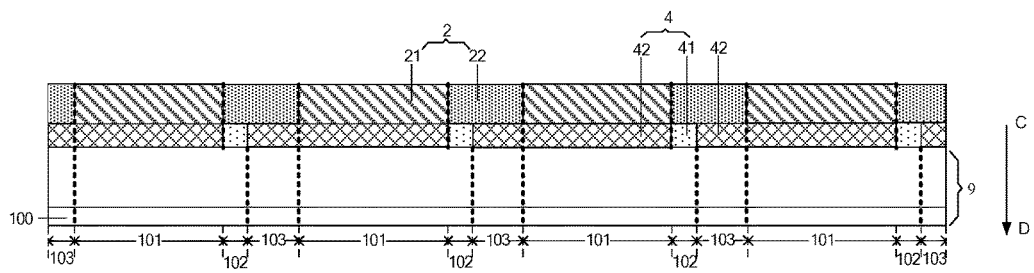
FIG. 12 is a cutting diagram of the sectional view along the M1-N1 direction in FIG. 3 corresponding to the step S903 in FIG. 9.

S903: as illustrated in FIG. 12, cutting from a position on a side of the barrier film 2 corresponding to a boundary line between the spaced area 103 and the display area 101 in the CD direction perpendicular to the barrier film 2, until the substrate 100 is cut.

It should be noted that the sequence of the steps S901, S902 and S903 may be mutually exchanged. No specific limitation will be given here. In order to simplify the process, the cutting process optimally adopts the sequence of S901, S902 and S903.

The adhesive portion 42 for covering the display area 101 and the adjacent portions (namely the non-adhesive portion 41 and the adhesive portion 42 for covering the spaced area 103) in the adhesive layer 4 as shown in FIG. 12 may be separate from each other by the above step. Meanwhile, as illustrated in FIG. 12, as the adhesive portion 42 for covering the spaced area 103 is respectively bonded with the portion to be removed 22 of the barrier film 2, the non-adhesive portion 41 and the substrate 100, after the cutting of the substrate by the above steps, the portion to be removed 22 of the barrier film 2, the adhesive portions 42 for covering the spaced area 103, the non-adhesive portions 41, and the substrate 100 bonded with the adhesive portions 42 for covering the spaced areas 103 may be completely stripped off by mechanical means only once. Therefore, the process can be greatly simplified and the package process time can be saved, and meanwhile, automatic package can be achieved.

Figure 13:
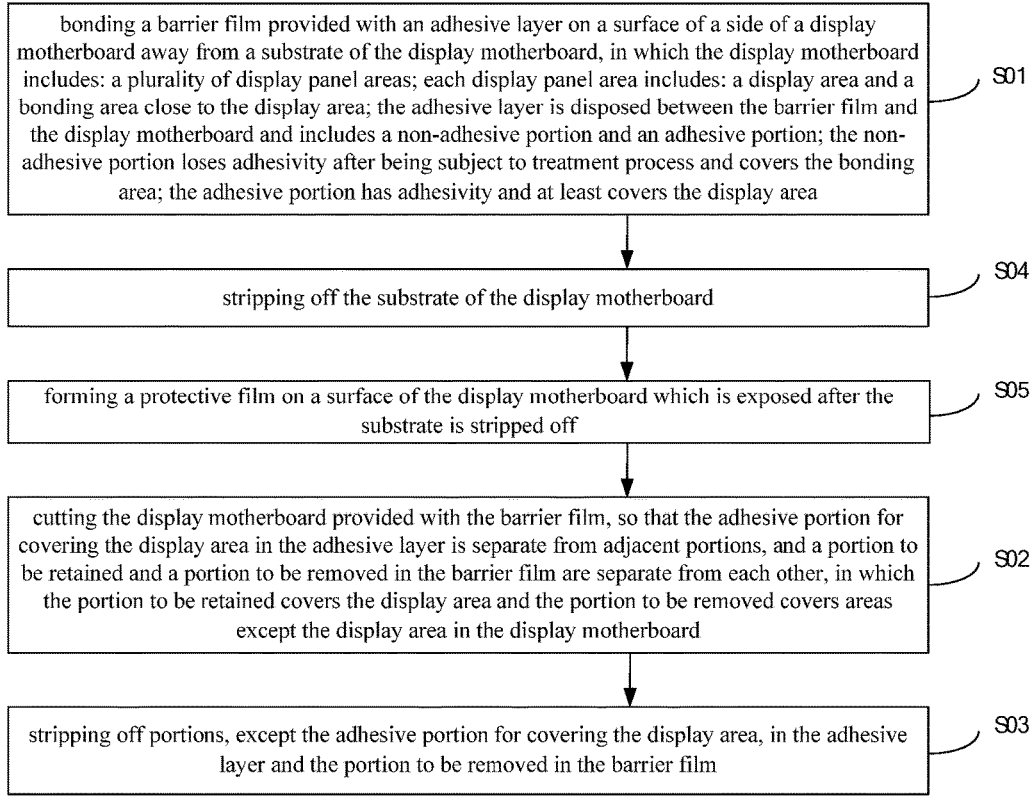
FIG. 13 is a flowchart of another package method of a flexible display panel, provided by the embodiment of the present invention.
Figure 14:
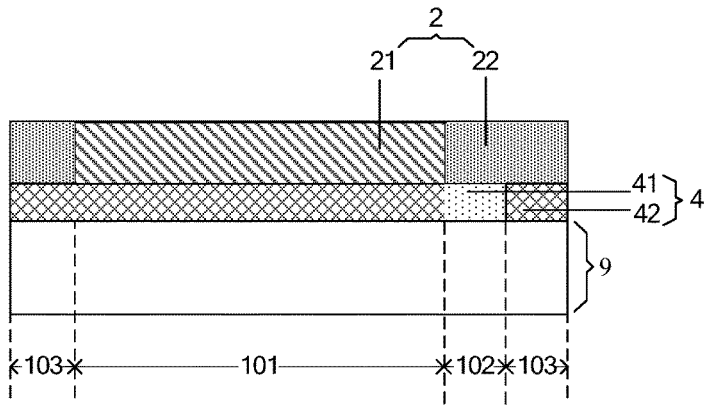
FIG. 14 is a schematic structural view of a structure obtained after the step S04 in FIG. 13.

Optionally, in order to further reduce the size of the flexible OLED display device, as illustrated in FIG. 13, after the step of bonding the barrier film provided with the adhesive layer on a side of the display motherboard away from the substrate of the display motherboard in S01 and before the step of cutting the display motherboard, the package method further comprises:

S04: stripping off the substrate 100 of the display motherboard 9 as shown in FIG. 7, and forming a structure as shown in FIG. 14. It should be noted here that: a PI film (not shown in the figure) may also be generally formed on the substrate 100 of the display motherboard 9; the PI film is very thin compared with the substrate 100; and after the substrate 100 is stripped off, the PI film may be taken as the substrate in one aspect and is conducive to the subsequent forming of a protective film in another aspect.

Figure 15:
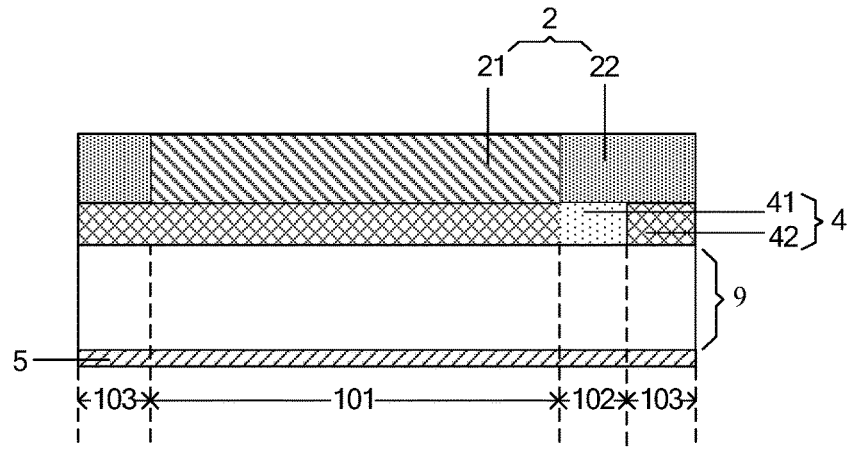
FIG. 15 is a schematic structural view of a structure obtained after the step S05 in FIG. 13.

S05: forming a protective film 5 on a surface of the display motherboard 9 as shown in FIG. 14 which is exposed after the substrate 100 is stripped off, and forming a structure as shown in FIG. 15.

It should be noted here that the specific means for forming the protective film is not limited in the embodiment of the present invention. Illustratively, the protective film may be directly adhered to the display motherboard by glue.

Figure 16:
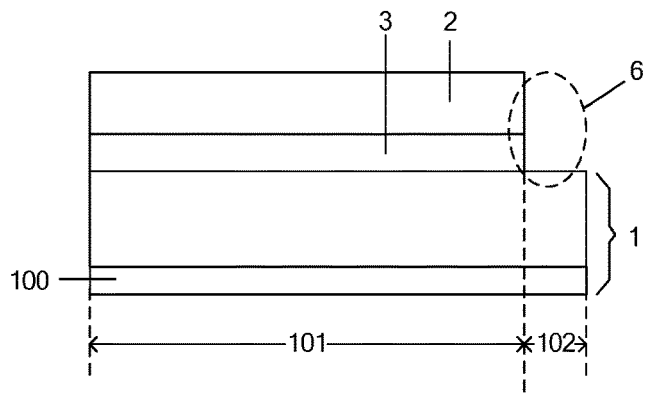
FIG. 16 is a schematic structural view of another flexible OLED display device.

The prior art also provides a package method of segmented bonding of the barrier film, which is as follows: firstly, glue is adhered to the barrier film; secondly, the glue is divided into first adhesive portions and second adhesive portions, in which the first adhesive portion corresponds to the display area of the flexible display panel and the second adhesive portion corresponds to the bonding area of the flexible display panel; thirdly, the barrier film is cut along a boundary line between the first adhesive portions and the second adhesive portions; and finally, the adhesive portions corresponding to the display areas and the barrier film are adhered to the display areas of the flexible display panel. Thus, as illustrated in FIG. 16, a step will be formed between a bonding area 102 and a display area 101 of a flexible display panel 1. Thus, after the substrate 100 of the flexible display panel is stripped off, when the protective film is bonded, air bubbles tend to be generated at positions of the protective film corresponding to the steps, and hence poor bonding can be caused.

In the present invention, as illustrated in FIG. 15, the barrier film 2 is entirely adhered to the display motherboard. Thus, when the protective film is bonded, no step is formed between the bonding area 102 and the display area 101 of the flexible display motherboard 9. Therefore, compared with the package method of segmented bonding of the barrier film, the problem of poor bonding of the protective film due to the step between the bonding area and the display area of the flexible display motherboard can be avoided.

Figure 17:
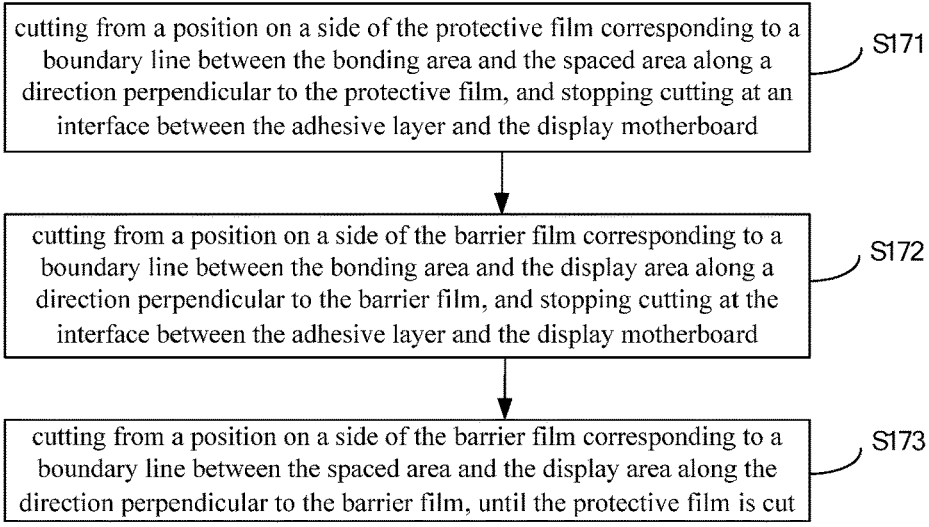
FIG. 17 is a flowchart of another method for cutting a flexible display motherboard provided with a barrier film, provided by the embodiment of the present invention.
Figure 18:
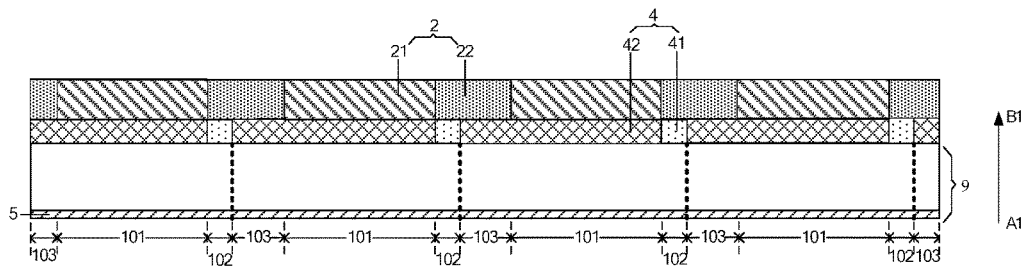
FIG. 18 is a cutting diagram of the sectional view along the M1-N1 direction in FIG. 3 corresponding to the step S171 in FIG. 17.

Moreover, after the step of forming the protective film on a side of the display motherboard away from the barrier film in S05, as illustrated in FIG. 17, the step of cutting the display motherboard provided with the barrier film in S02 specifically includes:

S171: as illustrated in FIG. 18, cutting from a position on a side of the protective film 5 corresponding to a boundary line between the bonding area 102 and the spaced area 103 in the A1B1 direction perpendicular to the protective film 5, and stopping cutting at an interface between the adhesive layer 4 and the display motherboard 9.

Figure 19:
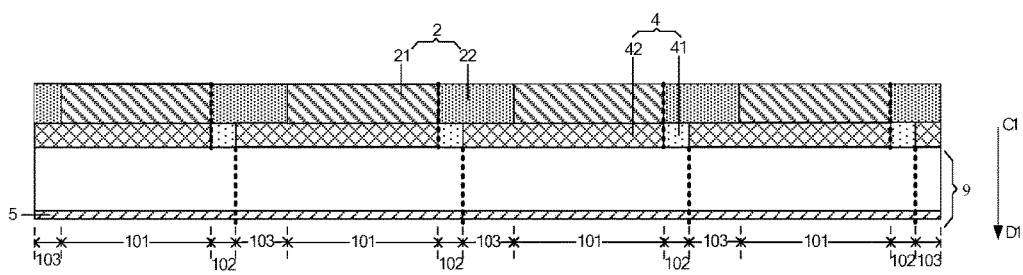
FIG. 19 is a cutting diagram of the sectional view along the M1-N1 direction in FIG. 3 corresponding to the step S172 in FIG. 17.

S172: as illustrated in FIG. 19, cutting from a position on a side of the barrier film 2 corresponding to a boundary line between the bonding area 102 and the display area 101 in the C1D1 direction perpendicular to the barrier film 2, and stopping cutting at the interface between the adhesive layer 4 and the display motherboard 9.

Figure 20:
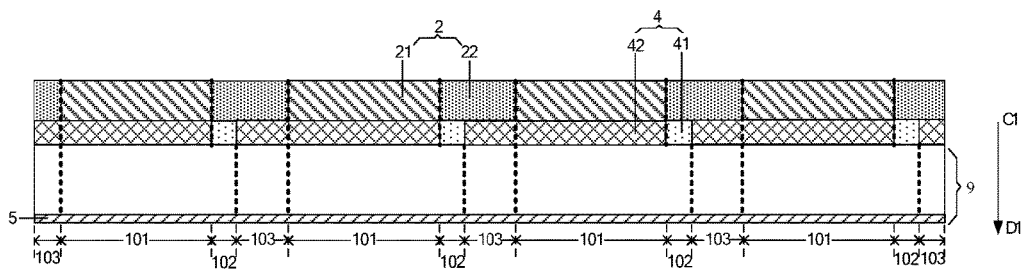
FIG. 20 is a cutting diagram of the sectional view along the M1-N1 direction in FIG. 3 corresponding to the step S173 in FIG. 17.

S173: as illustrated in FIG. 20, cutting from a position on a side of the barrier film 2 corresponding to a boundary line between the spaced area 103 and the display area 101 in the C1D1 direction perpendicular to the barrier film 2, until the protective film 5 is cut.

It should be noted that the sequence of the steps S171, S172 and S173 may be mutually exchanged. No specific limitation will be given here. In order to simplify the process, the cutting process optimally adopts the sequence of S171, S172 and S173.

Figure 21:
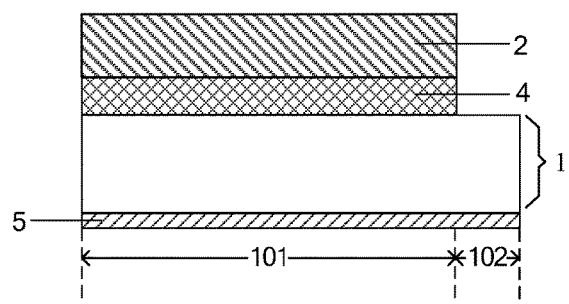
FIG. 21 is a schematic structural view of a packaged flexible display panel provided by the embodiment of the present invention.

The adhesive portion 42 for covering the display area 101 and the adjacent portions (namely the non-adhesive portion 41 and the adhesive portion 42 for covering the spaced area 103) in the adhesive layer 4 as shown in FIG. 15 may be separate from each other by the above step. Meanwhile, as illustrated in FIG. 20, as the adhesive portion 42 for covering the spaced area 103 is respectively bonded with the portion to be removed 22 of the barrier film 2, the non-adhesive portion 41 and the protective film 5, after the cutting of the protective film by the above steps, the portion to be removed 22 of the barrier film 2, the adhesive portion 42 for covering the spaced areas 103, the non-adhesive portions 41, and the protective film 5 bonded with the adhesive portions 42 for covering the spaced area 103 may be completely stripped off by mechanical means only once. Finally, a packaged display panel 1 as shown in FIG. 21 is obtained. Therefore, the process can be greatly simplified and the package process time can be saved, and meanwhile, automatic package can be achieved.

Figure 22:
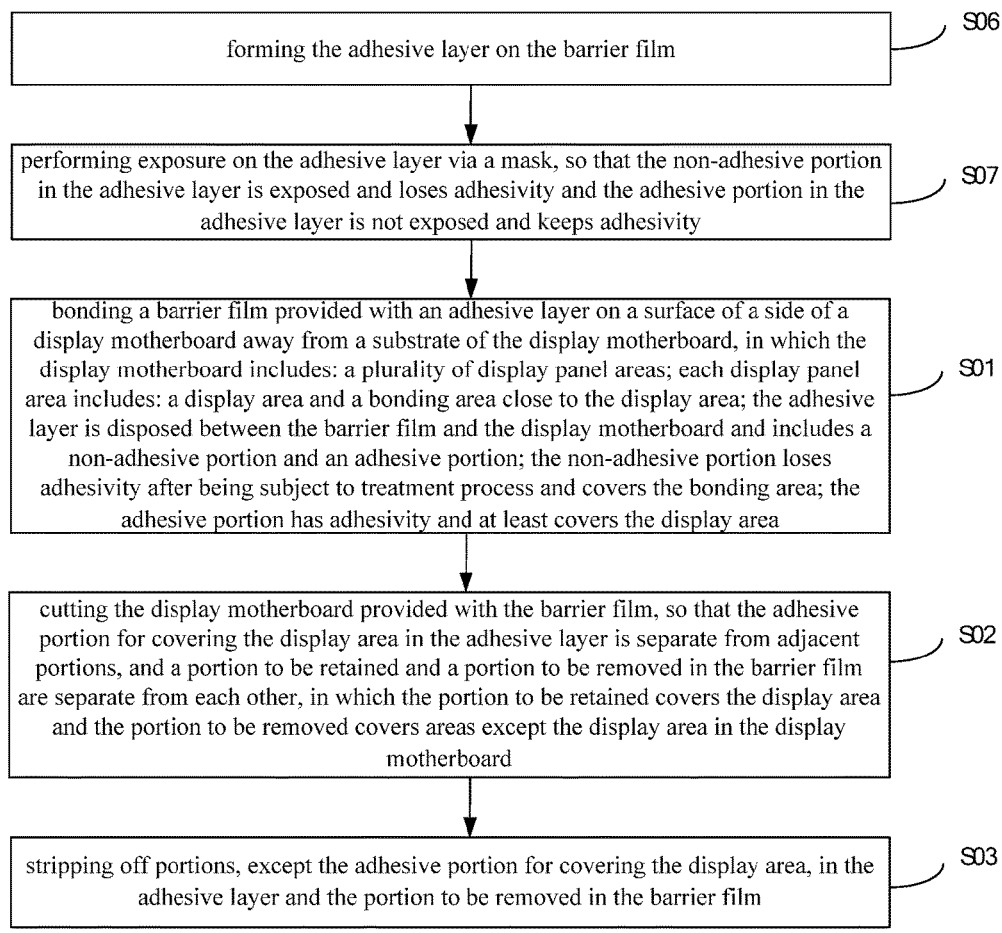
FIG. 22 is a flowchart of another package method of a flexible display panel, provided by the embodiment of the present invention.

Optionally, if the adhesive layer is an adhesive layer sensitive to light, as illustrated in FIG. 22, before the step of bonding the barrier film provided with the adhesive layer on the surface on a side of the display motherboard away from the substrate of the display motherboard in S01, the method further comprises:

S06: forming the adhesive layer on the barrier film.

For example, one layer of double-sensitive glue may be bonded on the barrier film.

S07: performing exposure on the adhesive layer via a mask, so that the non-adhesive portion in the adhesive layer is exposed and loses adhesivity and the adhesive portion in the adhesive layer is not exposed and keeps adhesivity.

For instance, the non-adhesive portion in the adhesive layer may correspond to a transparent portion of the mask and the adhesive portion corresponds to a non-transparent portion of the mask. Thus, after UV exposure, the non-adhesive portion in the adhesive layer may be exposed and loses adhesivity and the adhesive portion in the adhesive layer may be not exposed and keeps adhesivity.

Figure 23:
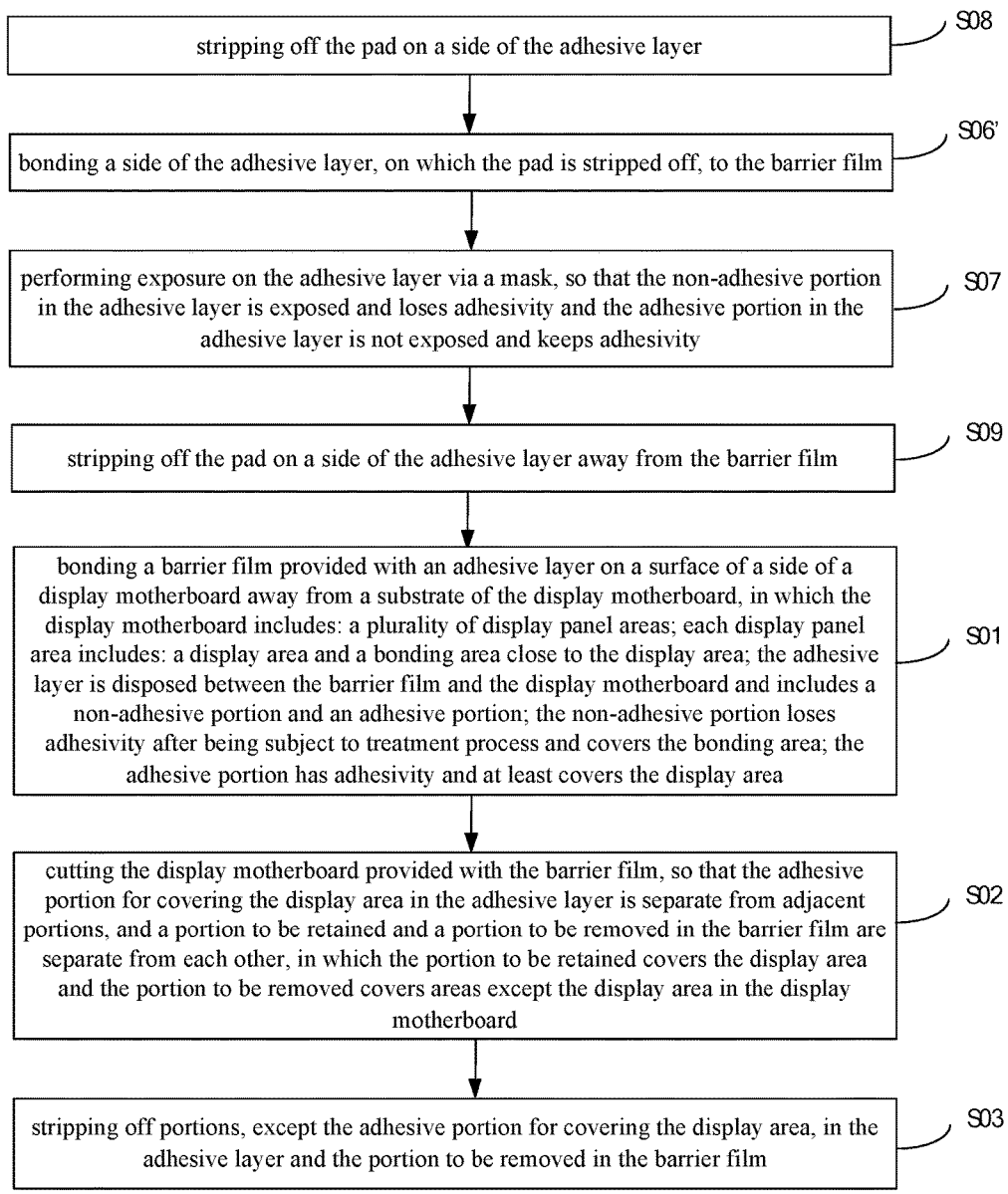
FIG. 23 is a flowchart of still another package method of a flexible display panel, provided by the embodiment of the present invention.

Optionally, in order to protect the adhesive layer and prevent dust, particles and the like from polluting the adhesive layer, pads are disposed on both sides of the adhesive layer. Thus, as illustrated in FIG. 23, before the step of forming the adhesive layer on the barrier film in S06, the package method further comprises: S08: stripping off the pad on a side of the adhesive layer.

Thus, the step of forming the adhesive layer on the barrier film in S06, for instance, is as follows:

S06': bonding a side of the adhesive layer, on which the pad is stripped off, on the barrier film.

After the step of performing exposure on the adhesive layer via the mask in S07 and before the step of bonding the barrier film provided with the adhesive layer on the surface on a side of the display motherboard, the package method further comprises:

S09: stripping off the pad on a side of the adhesive layer away from the barrier film.

Optionally, in order to improve the cutting efficiency and quality, the step of cutting the display motherboard provided with the barrier film in S02, for instance, includes: cutting the display motherboard by laser.

Second Embodiment

The embodiment of the present invention provides a flexible display panel. The display panel is packaged by any package method provided by the first embodiment. The flexible display panel may be combined to form a flexible display device, e.g., a flexible OLED display device.

Third Embodiment

The embodiment of the present invention provides a display device, which comprises the flexible display panel provided by the second embodiment. The display device may be a display device such as a flexible OLED display and any product or component with display function such as a TV, a digital camera, a mobile phone and a tablet PC including the display devices.

The foregoing is only the preferred embodiments of the present invention and not intended to limit the scope of protection of the present invention. The scope of protection of the present invention should be defined by the appended claims.

The application claims priority to the Chinese patent application No. 201610009622.X, filed on Jan. 6, 2016, the disclosure of which is incorporated herein by reference as part of the application.

The invention claimed is:

1. A package method of a flexible display panel, comprising:
bonding a barrier film provided with an adhesive layer on a surface of a side of a display motherboard away from a substrate of the display motherboard, in which the display motherboard includes: a plurality of display panel areas; each display panel area includes: a display area and a bonding area close to the display area; the adhesive layer is disposed between the barrier film and the display motherboard and includes a non-adhesive portion and an adhesive portion; the non-adhesive portion loses adhesivity after being subject to treatment process and covers the bonding area; the adhesive portion has adhesivity and at least covers the display area;
cutting the display motherboard provided with the barrier film, so that the adhesive portion for covering the display area in the adhesive layer is separate from adjacent portions, and a portion to be retained and a portion to be removed in the barrier film are separate from each other, in which the portion to be retained covers the display area and the portion to be removed covers areas except the display area in the display motherboard; and
stripping off portions, except the adhesive portion for covering the display area, in the adhesive layer and the portion to be removed in the barrier film.

2. The package method according to claim 1, wherein the display motherboard further includes: a spaced area disposed between two adjacent display panel areas; and the adhesive portion of the adhesive layer also covers the spaced area.

3. The package method according to claim 2, wherein cutting the display motherboard provided with the barrier film includes:
cutting from a position on a side of the substrate corresponding to a boundary line between the bonding area and the spaced area along a direction perpendicular to the substrate, and stopping cutting at an interface between the adhesive layer and the display motherboard;
cutting from a position on a side of the barrier film corresponding to a boundary line between the bonding area and the display area along a direction perpendicular to the barrier film, and stopping cutting at the interface between the adhesive layer and the display motherboard; and
cutting from a position on the side of the barrier film corresponding to a boundary line between the spaced area and the display area in the direction perpendicular to the barrier film, until the substrate is cut.

4. The package method according to claim 1, wherein after bonding the barrier film provided with the adhesive layer on the surface on a side of the display motherboard away from the substrate of the display motherboard and before cutting the display motherboard, the package method further comprises:
stripping off the substrate of the display motherboard; and
forming a protective film on a surface of the display motherboard which is exposed after the substrate is stripped off.

5. The package method according to claim 4, wherein cutting the display motherboard provided with the barrier film includes:
cutting from a position on a side of the protective film corresponding to a boundary line between the bonding area and the spaced area along a direction perpendicular to the protective film, and stopping cutting at an interface between the adhesive layer and the display motherboard;
cutting from a position on a side of the barrier film corresponding to a boundary line between the bonding area and the display area along a direction perpendicular to the barrier film, and stopping cutting at the interface between the adhesive layer and the display motherboard; and
cutting from a position on a side of the barrier film corresponding to a boundary line between the spaced area and the display area along the direction perpendicular to the barrier film, until the protective film is cut.

6. The package method according to claim 1, wherein the adhesive layer is an adhesive layer sensitive to light; and before bonding the barrier film provided with the adhesive layer on the surface on the side of the display motherboard away from the substrate of the display motherboard, the method further comprises:
forming the adhesive layer on the barrier film; and
performing exposure on the adhesive layer via a mask, so that the non-adhesive portion in the adhesive layer is exposed and loses adhesivity and the adhesive portion in the adhesive layer is not exposed and keeps adhesivity.

7. The package method according to claim 6, wherein a pad is respectively disposed on both sides of the adhesive layer;
before forming the adhesive layer on the barrier film, the package method further comprises:
stripping off the pad on a side of the adhesive layer;
forming the adhesive layer on the barrier film includes:
bonding a side of the adhesive layer, on which the pad is stripped off, to the barrier film; and
after performing exposure on the adhesive layer via the mask and before bonding the barrier film provided with the adhesive layer on the surface on a side of the display motherboard away from the substrate of the display motherboard, the package method further comprises:

stripping off the pad on a side of the adhesive layer away from the barrier film.

8. The package method according to claim 1, wherein cutting the display motherboard provided with the barrier film includes:

cutting the display motherboard by laser.

9. The package method according to claim 1, wherein a boundary of the bonding area and the display area in the display panel area is consistent with a boundary of the non-adhesive portion and the adhesive portion in the adhesive layer.

10. The package method according to claim 1, wherein an area covered by the non-adhesive portion is the same with an area covered by the bonding area.

11. The package method according to claim 1, wherein before stripping off the portion, except the adhesive portion for covering the display area, in the adhesive layer and the portion to be removed in the barrier film, the barrier film provided with the adhesive layer covers the entire area of the display motherboard.

* * * * *